United States Patent [19]
Negishi

[11] Patent Number: 6,119,257
[45] Date of Patent: Sep. 12, 2000

[54] SEMICONDUCTOR DEVICE TESTING APPARATUS CAPABLE OF HIGH SPEED TEST OPERATION

[75] Inventor: Toshiyuki Negishi, Ohra-gun, Japan

[73] Assignee: Advantest Corporation, Tokyo, Japan

[21] Appl. No.: 09/027,473

[22] Filed: Feb. 20, 1998

[30] Foreign Application Priority Data

Feb. 21, 1997 [JP] Japan ................................ 9-037535

[51] Int. Cl.[7] .............................................. G01R 31/28
[52] U.S. Cl. ............................................................ 714/738
[58] Field of Search .................................. 714/738, 739, 714/742, 744; 365/201

[56] References Cited

U.S. PATENT DOCUMENTS

| | | | |
|---|---|---|---|
| 5,177,630 | 1/1993 | Goutzoulis et al. | 714/738 X |
| 5,432,797 | 7/1995 | Takano | 714/738 |
| 5,592,496 | 1/1997 | Shimizu et al. | 714/738 |
| 5,606,568 | 2/1997 | Sudweeks | 714/738 |
| 5,850,402 | 12/1998 | Tsuto | 714/720 |

FOREIGN PATENT DOCUMENTS 019746302  4/1998  Germany .

*Primary Examiner*—Hoa T. Nguyen
*Attorney, Agent, or Firm*—Staas & Halsey

[57] ABSTRACT

An IC tester is provided which is capable of performing a high speed test of an IC under test without using a plurality of pin units for one pin of the IC under test. For each of pins of an IC under test are provided first and second two pattern generators first and second waveform shaping devices having waveform memories and respectively, first and second logical comparators and first and second failure analysis memories. Odd addresses of the first waveform memory are accessed by the first pattern generator, even addresses of the second waveform memory are accessed by the second pattern generator, and waveform data from these two waveform shaping devices are multiplexed for half of the period of a test pattern signal of the normal speed to set and reset first and scond set/reset flip-flops SRFF1 and SRFF2. As a result, a test pattern signal of high speed of twice the normal speed is produced and a test of an IC under test is implemented at high speed of twice the normal speed.

7 Claims, 8 Drawing Sheets

| A | | | B | | |
|---|---|---|---|---|---|
| | | PIN NO. 1 | | PIN NO. 1 | PIN NO. 2 |
| ADDRESS ↓ | 1 | "1" | ADDRESS ↓ | "1" | "O" |
| | 2 | "O" | | "L" | "H" |
| | 3 | "L" | | 3 | |
| | 4 | "H" | | | |
| | 5 | | | | |

FIG. 3

SEMICONDUCTOR DEVICE TESTING APPARATUS CAPABLE OF HIGH SPEED TEST OPERATION

BACKGROUND OF THE INVENTION

1. Field of the Invention

The present invention relates to a semiconductor device testing apparatus (commonly called an IC tester) which can be suitably used in testing a semiconductor device, particularly a semiconductor integrated circuit (hereinafter referred to as an IC) which is a typical example of semiconductor devices.

2. Description of the Related Art

FIG. 4 shows a general configuration of a conventional semiconductor device testing apparatus (hereinafter referred to as an IC tester) for testing an IC such as a semiconductor memory element, for instance. This IC tester comprises a timing generator TG, a pattern generator PG, a waveform shaping device FC, a logical comparator DC, and a failure analysis memory FM.

The timing generator TG supplies a reference timing clock to the pattern generator PG and other various portions. The pattern generator PG outputs a pattern generation command ($PAT_{ABC}$) by which a test pattern signal to be applied to an IC to be tested (IC under test, commonly called DUT) 10 is to be generated and an expected value data (EXP.DATA) by which an expected value signal to be applied to the logical comparator DC is to be generated, and supplies those signals to the waveform shaping device FC.

The waveform shaping device FC produces a test pattern signal PAT to be applied to the IC under test 10 and an expected value signal EXP to be applied to the logical comparator DC based on the pattern generation command and the expected value data supplied from the pattern generator PG. A write/read operation of a test pattern signal into/from the IC under test 10 is controlled by a control signal (CNTL.SIG) supplied via the waveform shaping device FC such that the writing operation of a test pattern signal supplied from the waveform shaping device FC into the IC under test 10 and the reading operation of data written into the IC therefrom are alternately repeated.

The data read out of the IC under test 10 is compared with an expected value data in the logical comparator DC to detect whether or not there is a discord between both signals. The failure analysis memory FM stores, every time a discord is detected in the logical comparator DC, a failure data, representing an occurrence of failure at the same address thereof as that of the IC under test 10 where that failure has occurred. To this end, the same address signal (ADR.SIG) as that applied to the IC under test 10 for reading the data therefrom is given to the failure analysis memory FM from the pattern generator PG. An failure analysis of the IC under test can be performed by reading the stored failure data in the failure analysis memory FM therefrom after the completion of the test.

The foregoing shows the whole configuration or construction and the operation of the IC tester. The present invention relates to an improvement of a device which is commonly called a pin unit in this technical field, the pin unit being provided for each of pins (terminals) of an IC under test 10. An object of the present invention is to enable a high speed operation of an IC tester by use of a simple construction of a pin unit.

FIG. 5 shows a general circuit arrangement of a conventional pin unit provided for each of pins of an IC under test.

Since each pin unit may have the same configuration with one another, a circuit arrangement of a pin unit for only one pin is shown in FIG. 5.

The pin unit UN comprises a pattern generator PG, a waveform shaping device FC, a logical comparator DC, a failure analysis memory FM, a driver DR for writing an analog signal from the waveform shaping device FC into an IC under test 10, a H-logic (high-logic) comparator CPH and an L-logic (low-logic) comparator CPL.

There is provided in the pattern generator PG a pattern memory in each address of which are stored, for example, a pattern generation command "1" ($PAT_{ABC}$="1") for applying a logical waveform having logical "1" (logical H or H-logic) to a pin of the IC under test 10, a pattern generation command "0" ($PAT_{ABC}$="0") for applying a logical waveform having logical "0" (logical L or L-logic) to a pin of the IC under test 10, an expected value data "L" ($PAT_{ABC}$="L") representing that an expected value signal is logical L, an expected value data "H" ($PAT_{ABC}$="H") representing that an expected value signal is logical H, and an expected pattern generation command "Z" ($PAT_{ABC}$="Z") representing that an expected value signal is high impedance, and the like. Those pattern generation commands and expected value data are read out from the pattern generator PG in the sequence specified by a pattern generating program.

A pattern generation command $PAT_{ABC}$ and an expected value data read out of the pattern generator PG are supplied to the waveform shaping device FC where a test pattern signal PAT (see FIG. 6C) having an analog waveform corresponding to the pattern generation command and an expected value signal EXP are produced or created. The test pattern signal PAT is inputted to one of the pins of the IC under test 10 via the driver DR. The expected value signal EXP is supplied to the logical comparator DC.

Moreover, the waveform shaping device FC further outputs a driver control signal DRE for controlling the state of the driver DR in addition to the test pattern signal PAT.

The driver control signal DRE is applied to a control terminal of the driver DR to control it such that the state of an output terminal of the driver DR is switched to an output mode or to a high impedance mode (inhibition of output mode). Specifically, during the output mode where the driver DR outputs a test pattern signal PAT, as shown in FIG. 6E, the driver control signal DRE applied to the control terminal of the driver DR remains, for example, logical H to maintain the output terminal of the driver DR in active state. On the other hand, during the high impedance mode where the data written into the IC under test 10 is read out therefrom, the driver control signal DRE applied to the control terminal of the driver DR remains, for example, logical L to maintain the output terminal of the driver DR in high impedance state (state of inhibition of output or inactive state).

During the read-out mode where the data is read out of the IC under test 10 (while the state of the output terminal of the driver DR is in the high impedance mode), the H-logic comparator CPH determines whether a logical level of the waveform of the data read out of the IC under test 10 has the normal logical H level $H_{ref}$ or not and outputs a decision signal SH, whereas the L-logic comparator CHL determines whether a logical level of the waveform of the data read out of the IC under test 10 has the normal L logical level $L_{ref}$ and outputs a decision signal SL.

Specifically, as shown in FIG. 7, the H-logic comparator CPH outputs logical 0 when the electric potential of a signal $S_{IC}$ read out from the IC under test 10 is higher than the normal logical H level $H_{ref}$ and outputs logical 1 in other conditions. On the other hand, the L-logic comparator CPL outputs logical 0 when the electric potential of the signal $S_{IC}$ is lower than the normal logical L level $L_{ref}$ and outputs logical 1 in other conditions. Further, the decision signals SH and SL are actually stamped out by strobe pulses STRB1 and STRB2 (see FIG. 6F) respectively, that is, the decision signals SH and SL are ANDed with the strobe pulses STRB1 and STRB2, respectively, and the results of decisions at the time points when the strobe pulses STRB1 and STRB2 are applied are outputted as the decision signals SH and SL, respectively.

The logical comparator DC are supplied with the decision results SH and SL from the comparators CPH and CPL, and compare the decision results SH and SL with the expected value signals EXP provided from the waveform shaping device FC. Every time the decision result SH or SL does not coincide with the corresponding expected value signal EXP, a failure data of, for instance, logical "1" representing a failure occurrence is written in the same address of the failure analysis memory FM as that of the IC under test 10 where the failure has occurred. For example, in case the address of the IC under test 10 where the failure has occurred is the address "2", logical "1" is written in the address "2" of the failure analysis memory FM.

FIG. 8 further shows in detail the circuit configuration of the section of the waveform shaping device FC and the logical comparator DC of the pin unit UN.

The waveform shaping device FC comprises a waveform memory WFM into which a pattern generation command $PAT_{ABC}$ (in this example, a command of 3 bits) from the pattern generator PG is inputted, a combination circuit of gate group (in this example, consisting of four AND gates and two OR gates) and a first set/reset flip-flop SRFF1 for producing a test pattern signal PAT on the basis of output signals from the waveform memory WFM, and a combination circuit of gate group (in this example, consisting of two AND gates) and a second set/reset flip-flop SRFF2 for producing a driver control signal DRE on the basis of output signals from the waveform memory WFM.

There are previously stored in the waveform memory WFM, in this example, waveform data T1S and T2S each of logical H, waveform data T1R and T2R each of logical L, waveform data T3L and T4T for defining a logical level of the driver control signal DRE, waveform data EXP1, EXP1Z, EXP2 and EXP2Z each of which defines a logical level of the expected value signal, and the like.

When the waveform data T1S of logical "H" is read out of the waveform memory WFM in response to a pattern generation command of logical "1" from the pattern generator PG, the rising portion of the waveform data T1S is stamped out by a clock pulse $T_1$ in the associated AND gate, that is, the rising portion of the waveform data T1S is ANDed with the clock pulse $T_1$ in the associated AND gate so that a pulse T1 is formed as shown in FIG. 6B. This pulse T1 is given to a set terminal S of the first set/reset flip-flop SRFF1 thereby generating an output of logical "1" from the first set/reset flip-flop SRFF1 at the leading edge of the pulse. That is, the timing of the leading edge (rise) of a test pattern signal PAT having a real waveform (see FIG. 6C) is defined.

Next, when the waveform data T1R of logical "L" is read out of the waveform memory WFM in response to a pattern generation command of logical "0" from the pattern generator PG, the rising portion of the waveform data T1R is stamped out by a clock pulse $T_1$ in the associated AND gate, that is, the rising portion of the waveform data T1S is ANDed with the clock pulse $T_1$ in the associated AND gate so that a pulse T1' is formed as shown in FIG. 6B. This pulse T1' is given to a reset terminal R of the first set/reset flip-flop SRFF1 thereby inverting the output of logical "1" of the first set/reset flip-flop SRFF1 to logical "0" at the leading edge of the pulse. That is, the timing of the trailing edge (fall) of the test pattern signal PAT having a real waveform is defined.

Though it is not shown in FIG. 6, in case waveform data T2S, T2R are read out of the waveform memory WFM, like the above-described case, the rising portions of these waveform data T2S, T2R are stamped out by a clock pulse $T_2$ in the associated AND gates, respectively, to be given to the set terminal S and reset terminal R of the first set/reset flip-flop SRFF1 so that a test pattern signal PAT having a real waveform is generated from the first set/reset flip-flop SRFF1.

In addition, in a write mode where a test pattern signal PAT is written into an IC under test, the waveform data T3L is read out of the waveform memory WFM in response to a pattern generation command from the pattern generator PG, and the rising portion of the waveform data T3L is stamped out by a clock pulse $T_3$ in the associated AND gate, that is, the rising portion of the waveform data T3L is ANDed with the clock pulse $T_3$ in the associated AND gate so that a pulse T3 is formed as shown in FIG. 6D. This pulse T3 is given to a set terminal S of the second set/reset flip-flop SRFF2 thereby generating an output of logical "1" from the second set/reset flip-flop SRFF2 at the leading edge of the pulse. That is, the timing of the leading edge (rise) of a driver control signal DRE having a real waveform (see FIG. 6E) is defined.

Also, the waveform data T4T is read out of the waveform memory WFM in response to a pattern generation command from the pattern generator PG, and the rising portion of the waveform data T4T is stamped out by a clock pulse $T_4$ in the associated AND gate, that is, the rising portion of the waveform data T4T is ANDed with the clock pulse $T_4$ in the associated AND gate so that a pulse T4 is formed as shown in FIG. 6D. This pulse T4 is given to a reset terminal R of the second set/reset flip-flop SRFF2 thereby inverting the output of logical "1" of the second set/reset flip-flop SRFF2 to logical "0" at the leading edge of the pulse. That is, the timing of the trailing edge (fall) of the driver control signal DRE having a real waveform is defined.

The logical comparator DC comprises, in this example, two AND gates supplied with expected value signals EXP1 and EXP1Z to respective non-inverting inputs thereof respectively, further two AND gates supplied with expected value signals EXP2 and EXP2Z to respective non-inverting inputs thereof respectively, and an OR gate for multiplexing output signals from these four AND gates to supply the multiplexed signal to the failure analysis memory FM. Also, the output SH of the H-logic comparator CPH is supplied to respective the other non-inverting inputs of the AND gates to which the expected value signals EXP1 and EXP1Z are supplied, and the output SL of the L-logic comparator CPL is supplied to respective the other non-inverting inputs of the AND gates to which the expected value signals EXP2 and EXP2Z are supplied. Further, the other inputs of the AND gates to which the expected value signals EXP1Z and EXP2Z are supplied are inverting inputs.

The logical comparator DC compares the expected value signal EXP1 or EXP1Z with a decision signal SH outputted from the H-logic comparator CPH, or the expected value signal EXP2 or EXP2Z with a decision signal SL outputted from the L-logic comparator CPL. When the expected value signal does not accord with the decision signal, that is, when the signal $S_{IC}$ outputted from the IC under test 10 does not coincide with the level of the expected value signal, the logical comparator DC outputs a failure data of logical "1" via the OR gate, which is written in the failure analysis memory FM.

The operation speed of the IC tester described above is determined by a period T shown in FIG. 6. As one of methods for making the operation speed higher, there has been heretofore provided a method called a pin multiplex method in this technical field. This pin multiplex method is arranged such that a test is carried out by preparing the circuit arrangement for one pin shown in FIGS. 5 and 8 by two sets for one pin, and by operating two waveform shaping devices FC in the two sets in time division basis to produce a test pattern signal having a high speed or rate by two times, and by operating two logical comparators DC in the two sets in time division basis to perform their logical comparison operations at a high speed or rate by two times.

In case of operating an IC tester at high speed of twice the normal speed by use of this pin multiplex method, two sets of pin units UN are used for one pin and hence a problem occurs that the number of pins of an IC under test which are testable at one time is reduced to half.

As is well known, since an IC tester is manufactured such that the number of testable pins of an IC under test at one time is determined in advance, there is a limitation on the number of pin units UN prepared in each IC tester, that is, the number of pin units previously prepared in each IC tester is limited to a fixed number. As mentioned above, if two sets of pin units are used for one pin to perform a high speed test of an IC, the number of pins of an IC under test which are simultaneously testable at high speed is reduced to half of the number of pins of that IC in the normal speed test. Accordingly, there is a need that a high speed test is carried out twice, resulting in a drawback that a high speed test cannot be actually attained by such a pin multiplex method.

SUMMARY OF THE INVENTION

It is an object of the present invention to provide a semiconductor device testing apparatus which is capable of performing a high speed test without decreasing the number of testable pins of a semiconductor device under test at one time.

In accordance with the present invention, there is provided, in a semiconductor device testing apparatus for testing a semiconductor device under test wherein a test pattern signal to be applied to a semiconductor device under test and expected value signals to be applied to a logical comparator are generated from waveform shaping means in response to a pattern generation commands generated from a pattern generator, and the test pattern signal is applied to the semiconductor device under test to test the semiconductor device under test, the semiconductor device testing apparatus including pin units each being provided for corresponding one of pins of a semiconductor device under test, each of the pin units comprising: first and second two pattern generating means; waveform shaping means including first waveform storage means supplied with pattern generation commands from one of the two pattern generating means and second waveform storage means supplied with pattern generation commands from the other of the two pattern generating means; switching means for switching supply paths of the pattern generation commands from the two pattern generating means to the two waveform storage means so as to supply only pattern generation commands from either one of the two pattern generating means simultaneously to the first and second waveform storage means in case a test pattern signal of the normal speed is produced, and to supply pattern generation commands from one of the two pattern generating means to the first waveform storage means and pattern generation commands from the other of the two pattern generating means to the second waveform storage means in case a test pattern signal of a higher speed than the normal speed is produced; and means for producing a test pattern signal based on the waveform data read out of the first and second waveform storage means.

In a preferred embodiment of the present invention, the means for producing a test pattern signal produces a test pattern signal having any one of periods between the period of a test pattern signal of the normal speed and half of the period.

In addition, each of the pin units further comprises: a first logical comparator for comparing data read out of a semiconductor device under test with an expected value signal supplied from the first waveform storage means; a second logical comparator for comparing data read out of the semiconductor device under test with an expected value signal supplied from the second waveform storage means; a first failure analysis memory for storing a comparison result from the first logical comparator; and switching means for switching supply paths of the comparison results from the two logical comparators to the two failure analysis memories so as to supply comparison results from the first and second logical comparators simultaneously to the first and second failure analysis memories.

In case a test pattern signal of a high speed is produced, odd addresses of the first waveform storage means are accessed by pattern generation commands from one of the two pattern generating means, and even addresses of the second waveform storage means are accessed by pattern generation commands from the other of the two pattern generators.

In the present invention, as described above, there are prepared two pattern generators for each of pins of an IC under test from which two pattern generation commands are simultaneously generated, and the two pattern generation commands are separately supplied to corresponding waveform shaping devices respectively thereby generating two waveform data therefrom which are multiplexed to produce a test pattern signal at high speed of twice the normal speed. As a result, by applying this test pattern signal having high speed of twice the normal speed to a semiconductor device under test, it is possible to carry out a high speed test for the semiconductor device.

According to the above construction of the present invention, since a high speed operation can be effected for each pin unit, in case one or more pin units are operating at high speed, the remaining pin units can be used independently of one another. Therefore, the number of testable pins of a semiconductor device at one time is not reduced.

BRIEF DESCRIPTION OF THE DRAWINGS

FIG. 3 is an illustration for explaining the functional effects obtained by the semiconductor device testing apparatus shown in FIG. 1;

DETAILED DESCRIPTION OF PREFERRED EMBODIMENTS

Now, an embodiment of the semiconductor device testing apparatus according to the present invention will be described with reference to FIGS. 1 to 3. In the following description, for clarity of understanding, a case will be discussed in which the present invention is applied to an IC tester for testing an IC which is a typical example of semiconductor devices. However, it is needless to say that the present invention can similarly be applied to a semiconductor device testing apparatus for testing a semiconductor device other than an IC.

Figure 1:
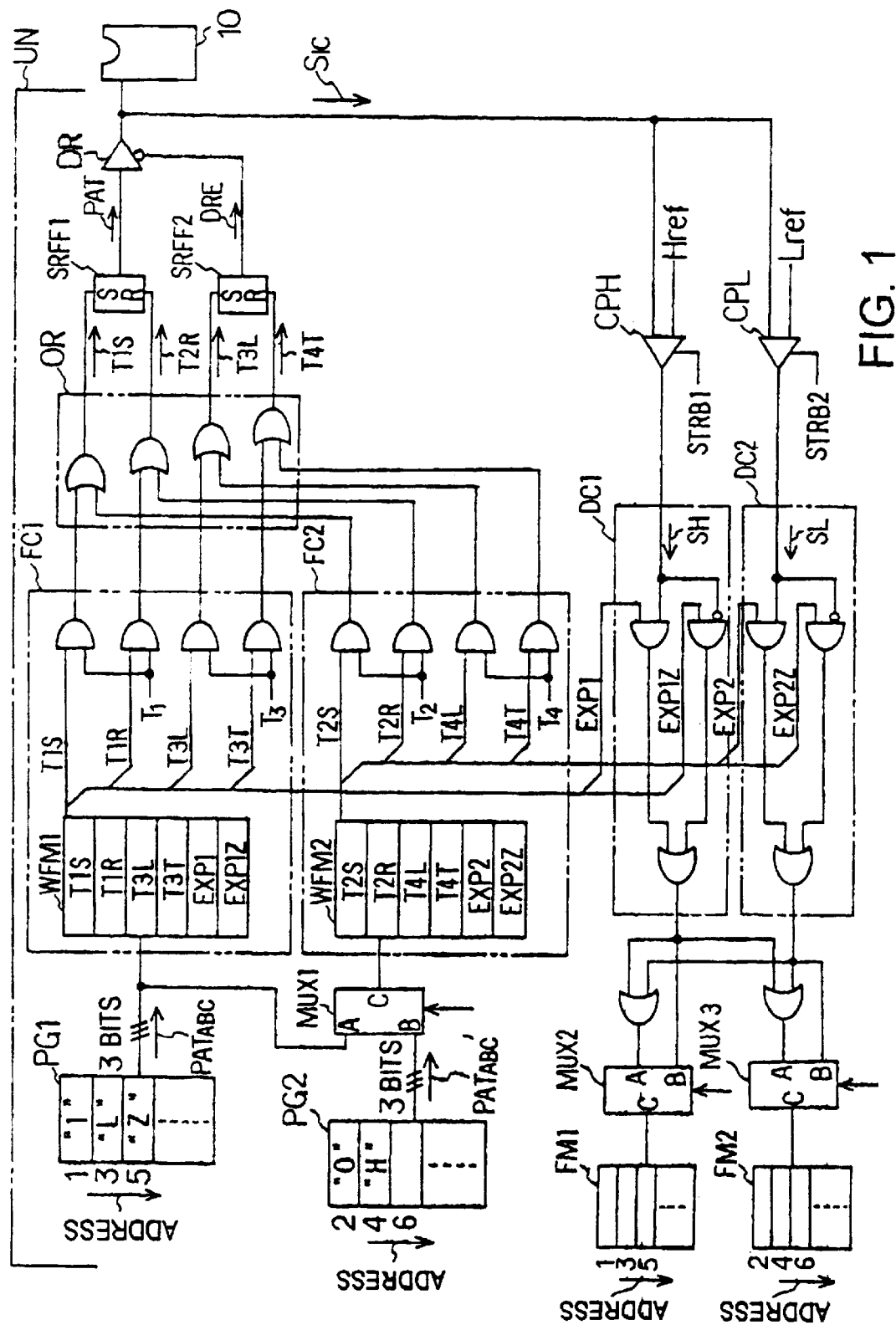
FIG. 1 is a block diagram showing an embodiment of a semiconductor device testing apparatus according to the present invention.
Figure 2:
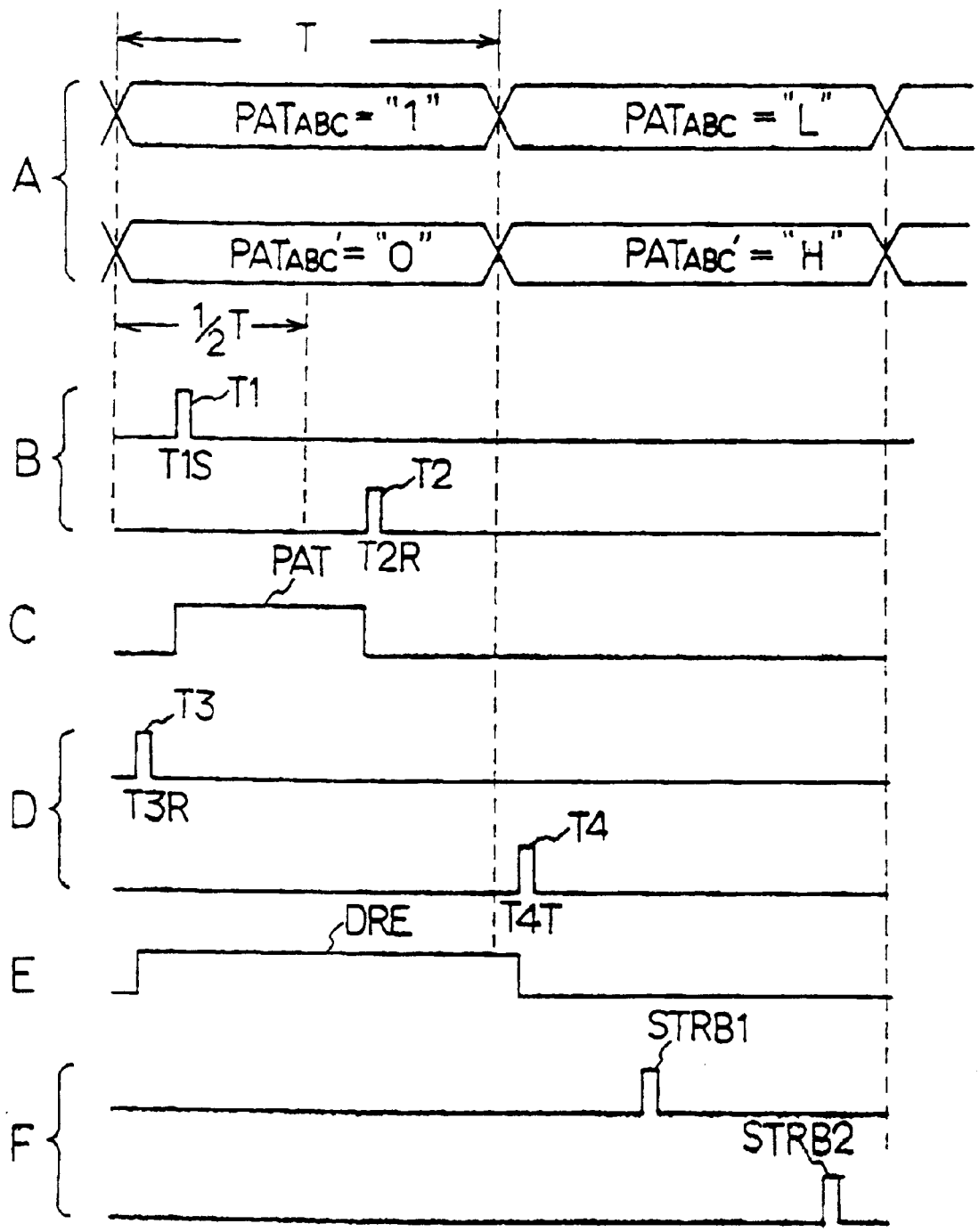
FIG. 2 is a waveform diagram for explaining the operation of the semiconductor device testing apparatus shown in FIG. 1.
Figure 4:
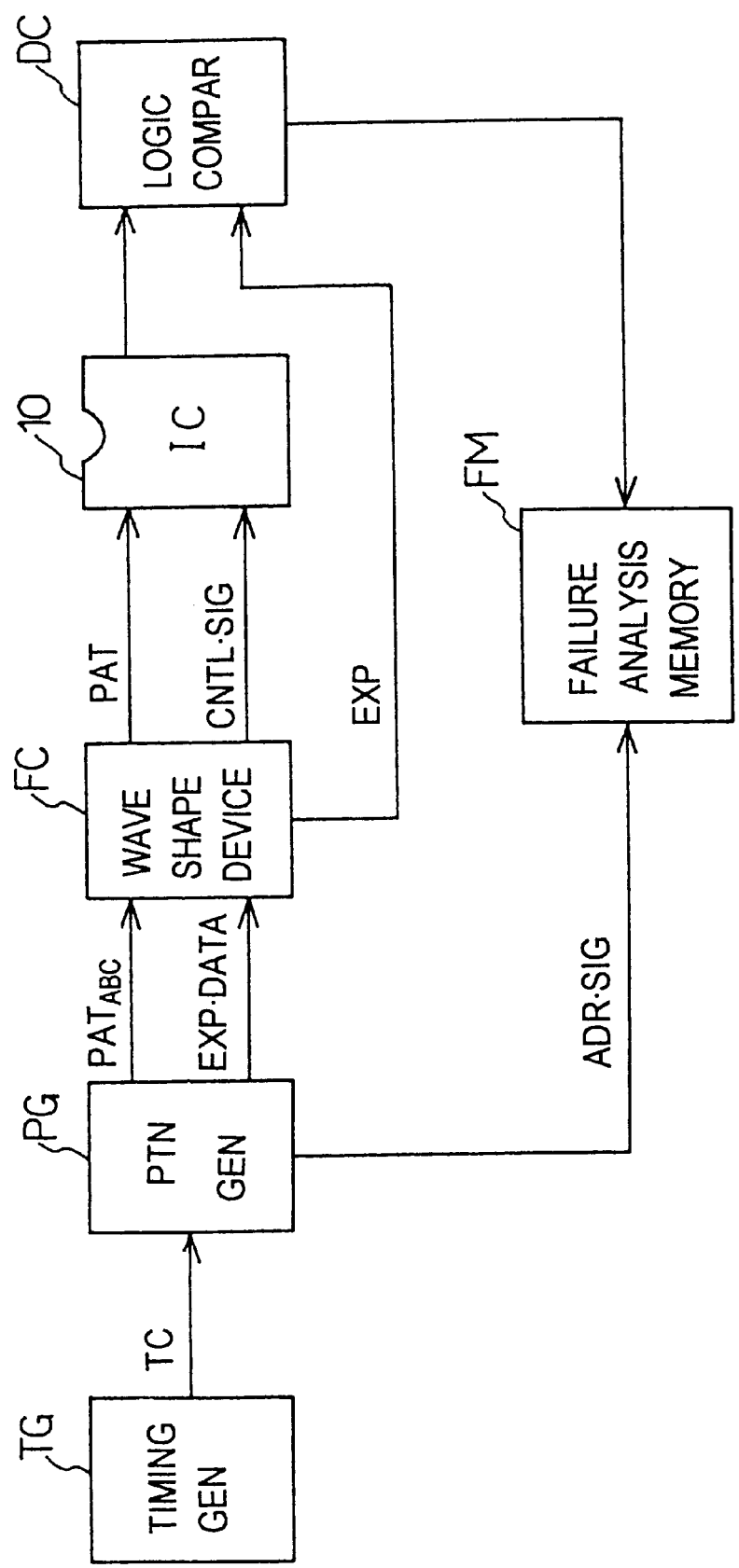
FIG. 4 is a block diagram showing the general construction of a conventional IC tester.
Figure 5:
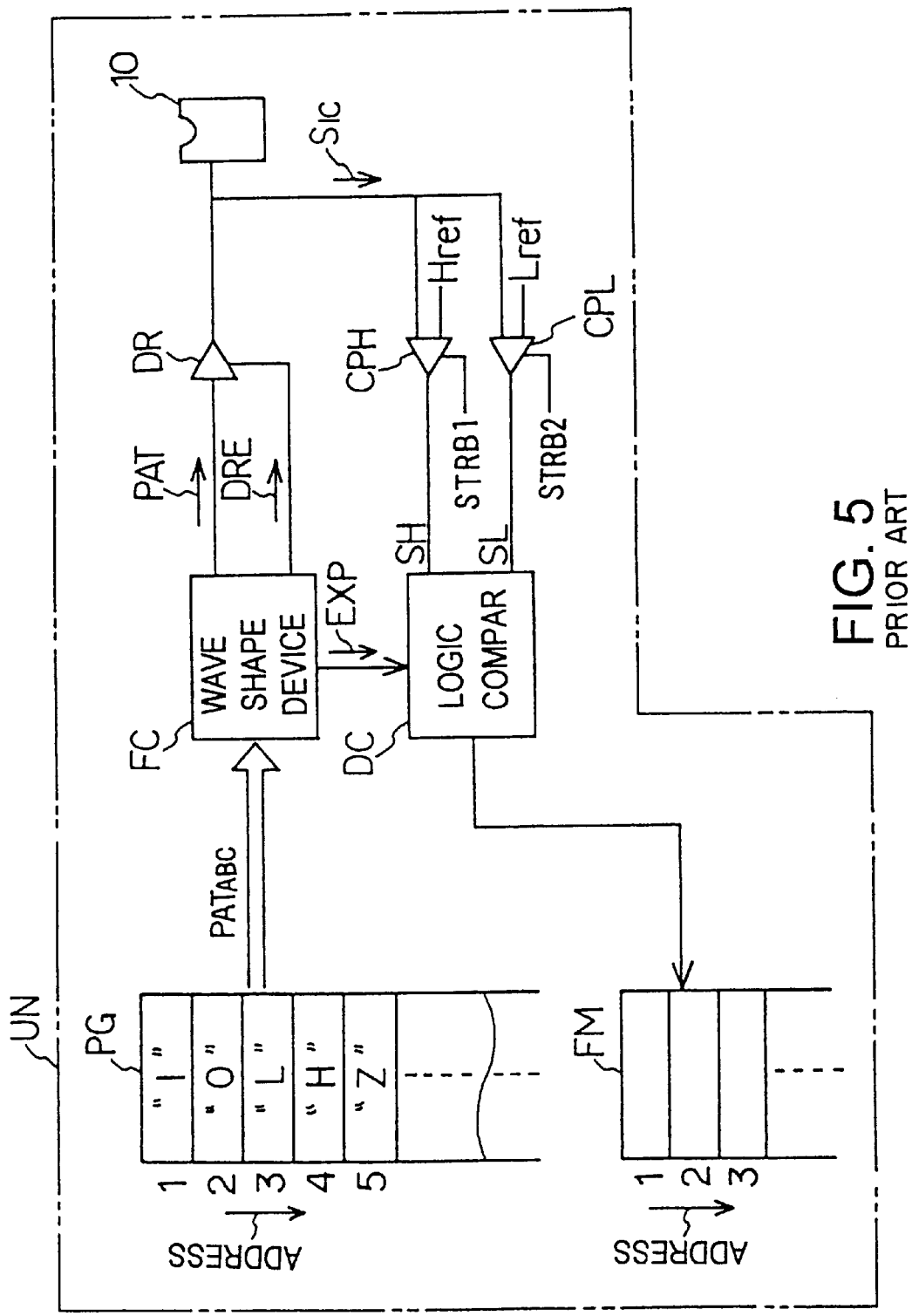
FIG. 5 is a block diagram showing the circuit configuration of one of pin units in the IC tester shown in FIG. 4.
Figure 8:
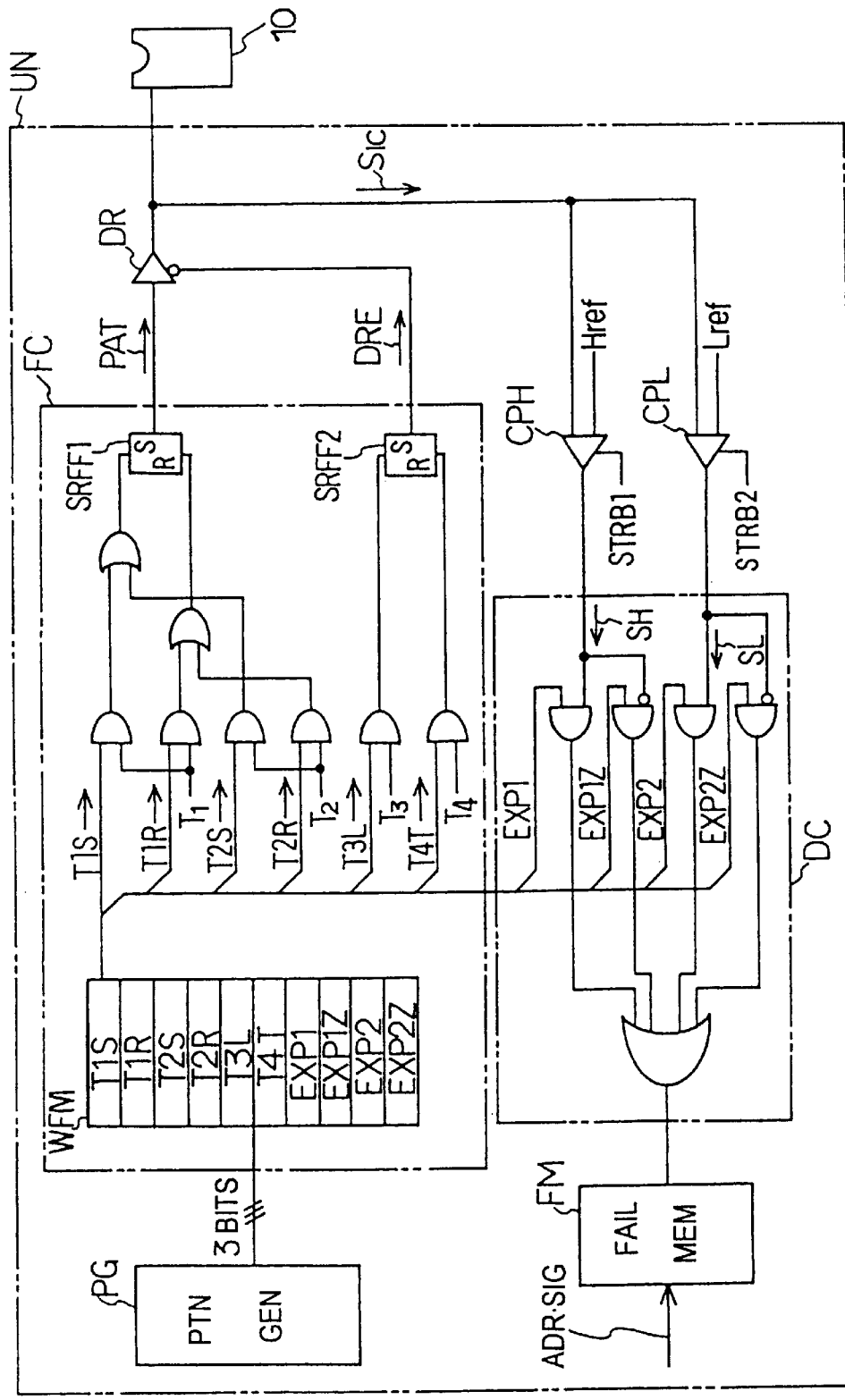
FIG. 8 is a block diagram showing in detail the circuit configuration of the pin unit shown in FIG. 5.

FIG. 1 is a block diagram showing the circuit configuration of an embodiment of the IC tester to which the present invention is applied. Further, portions or elements in FIG. 1 corresponding to those in FIGS. 4, 5 and 8 are shown by the same reference characters affixed thereto, and the explanation thereof will be omitted unless necessary.

In the present invention, as shown in FIG. 1, for each of pin units UN in the IC tester are provided first and second two pattern generators PG1 and PG2, first and second two waveform shaping devices FC1 and FC2, first and second two logical comparators DC1 and DC2, first, second and third three multiplexers MUX1, MUX2 and MUX3 which are switches for switching between the normal speed test and a high speed test, and first and second failure analysis memories FM1 and FM2.

Figure 6:
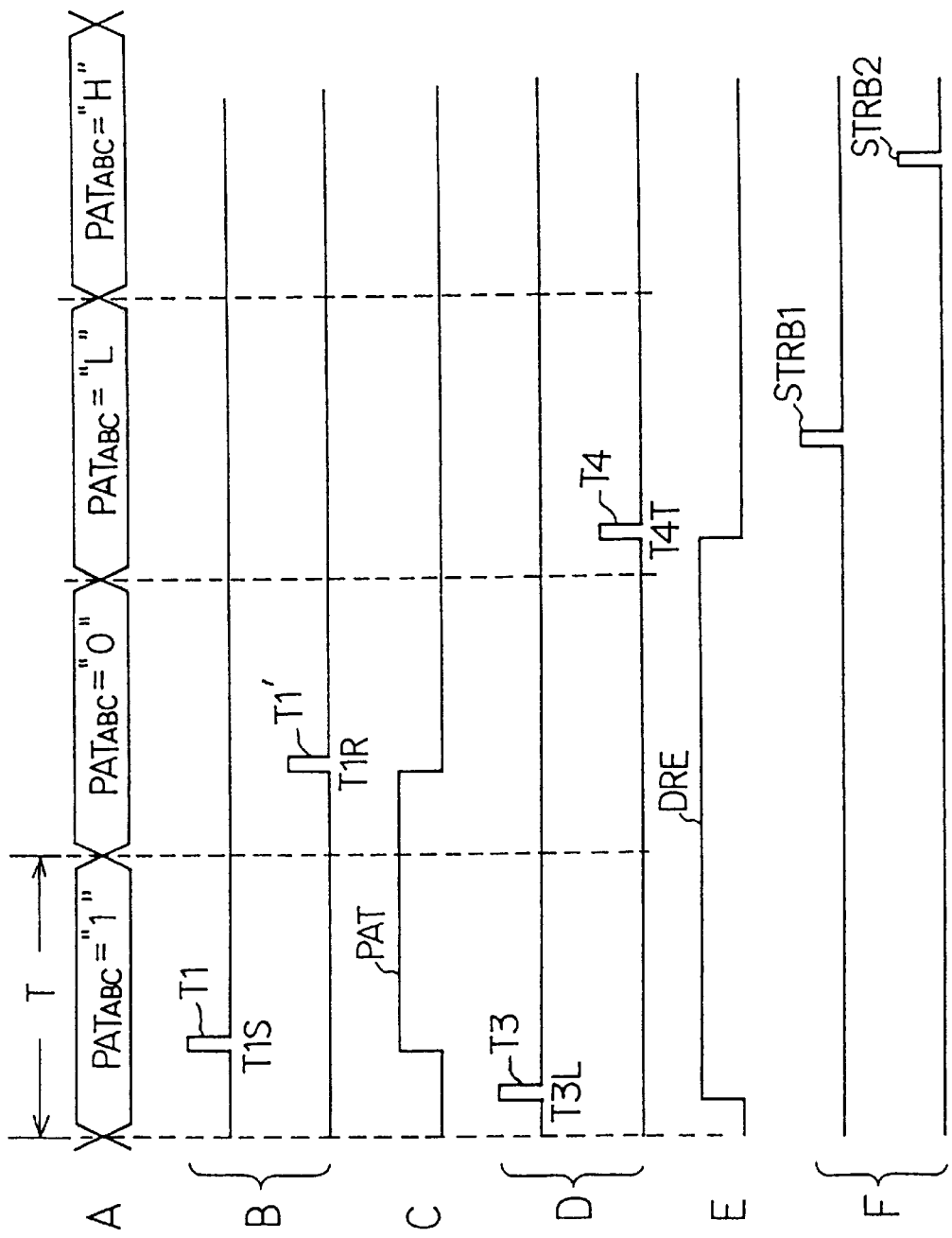
FIG. 6 is a waveform diagram for explaining the operation of the pin unit shown in FIG. 5.
Figure 7:
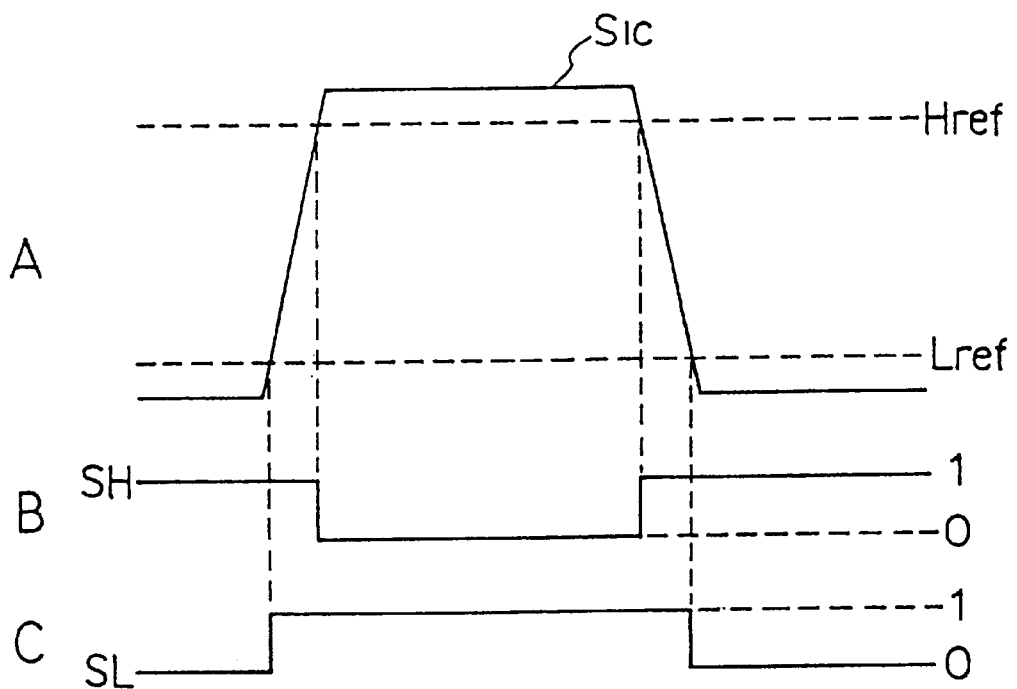
FIG. 7 is a waveform diagram for explaining the operations of the H-logic comparator and L-logic comparator in the pin unit shown in FIG. 5.

Each of the multiplexers MUX1–MUX3 is set in the normal speed test such that their input terminals A are selected to be connected to their output terminals C. Specifically, in this normal speed test, a pattern generation command of three bits outputted from the first pattern generator PG1 is simultaneously inputted to the two waveform shaping devices FC1 and FC2 for one test period T by means of the first multiplexer MUX1, and waveform data are simultaneously read out of these two waveform shaping devices FC1 and FC2 in one test period T whereby a test of the IC under test 10 is carried out at the speed or rate of the same period T as that described with reference to FIG. 6. In addition, since the second and third multiplexers MUX2 and MUX3 have their input terminals A selected to be connected to their output terminals C, a failure data is simultaneously written in the first and second failure analysis memories FM1 and FM2.

On the other hand, in a high speed test, each of the multiplexers MUX1–MUX3 is set such that their input terminals B are selected to be connected to their output terminals C. Specifically, in this high speed test, a pattern generation command of three bits outputted from the first pattern generator PG1 is inputted only to the first waveform shaping device FC1 and a pattern generation command of three bits outputted from the second pattern generator PG2 is inputted only to the second waveform shaping device FC2 by means of the first multiplexer MUX1. Moreover, since the second and third multiplexers MUX2 and MUX3 have their input terminals B selected to be connected to their output terminals C, a failure data from the first logical comparator DC1 is written only in the first failure analysis memory FM1 and a failure data from the second logical comparator DC2 is written only in the second failure analysis memory FM2. As a result, failure data are separately supplied to the first and second failure analysis memories FM1 and FM2, and hence it is possible to store failure data of a high speed, that is, to store failure data in the failure analysis memories FM1 and FM2 at a high speed or rate.

Further, FIG. 1 illustrates the state of a high speed test wherein addresses of the pattern generators PG1, PG2 and addresses of the failure analysis memories FM1, FM2 are shown such that the first is only odd addresses and the scond is only even addresses. However, addresses of the two pattern generators PG1, PG2 and addresses of the two failure analysis memories FM1, FM2 are in fact in order from address 1 (include odd and even addresses). In addition, the waveform memories WFM1, WFM2 of the two waveform shaping devices FC1, FC2 really have stored both odd and even waveform data (a combination of waveform data of both the waveform memories).

The operation of the pin unit UN in a high speed test will be discussed. In case of the high speed test, each of the first to the third multiplexers MUX1–MUX3 selects the input terminal B to be connected to its output terminal C. By selection of the input terminal B in the first multiplexer MUX1, pattern generation commands $PAT_{ABC}$ and $PAT_{ABC}'$ outputted respectively from the first and second pattern generators PG1 and PG2 are inputted separately to the corresponding first and second waveform shaping devices FC1 and FC2 at the same time respectively from which two waveform data are simultaneously outputted. These waveform data are stamped out in their rise portions by clocks $T_1$–$T_4$ in a group of AND gates (ANDed with clocks $T_1$–$T_4$), and the stamped pulses are multiplexed in a group of OR gates OR for the period of T/2 thereby generating a test pattern signal PAT of high speed and a driver control signal DRE of high speed each having a real waveform.

Explaining in more detail, in case of the high speed test, only odd addresses of the first pattern generator PG1 are accessed as shown in FIG. 1, thereby to output a pattern generation command $PAT_{ABC}$ of three bits at one of odd addresses. Likewise, only even addresses of the second pattern generator PG2 are accessed, thereby to output a pattern generation command $PAT_{ABC}'$ of three bits at one of even addresses. These pattern generation commands $PAT_{ABC}$ and $PAT_{ABC}'$ are inputted to the corresponding first and second waveform shaping devices FC1 and FC2, respectively.

First, when the waveform data T1S is read out of the first waveform memory WFM1 in response to a pattern generation command of logical "1" from address "1" of the first pattern generator PG1, the rising portion of the waveform data T1S is stamped out by a clock pulse $T_1$ in the associated AND gate, that is, the rising portion of the waveform data T1S is ANDed with the clock pulse $T_1$ in the associated AND gate so that a pulse T1 is formed as shown in FIG. 1B. This pulse T1 is given to a set terminal S of the first set/reset flip-flop SRFF1 thereby generating an output of logical "1" from the first set/reset flip-flop SRFF1 at the leading edge of the pulse.

At the same time, when the waveform data T2R is read out of the second waveform memory WFM2 in response to a pattern generation command of logical "0" from address "2" of the second pattern generator PG2, the rising portion of the waveform data T2R is stamped out by a clock pulse $T_2$ in the associated AND gate, that is, the rising portion of the waveform data T2R is ANDed with the clock pulse $T_2$ in the associated AND gate so that a pulse T2 is formed as shown in FIG. 1B. This pulse T2 is given to a reset terminal R of the first set/reset flip-flop SRFF1 thereby inverting the output of logical "1" of the first set/reset flip-flop SRFF1 to the output of logical "0" at the leading edge of the pulse.

These pulses T1, T2 in the first period T are multiplexed in the group of OR gates OR for half of the period T. Therefore, in case the waveform data T1S is stamped out by the first clock $T_1$ in the first half period (T/2) and the waveform data T2R is stamped out by the first clock $T_2$ in the latter half period (T/2), a test pattern signal PAT of T/2 period is produced as shown in FIG. 1C. This test pattern signal PAT of T/2 period is applied to the IC under test 10 through the driver DR.

Since the period T/2 of the test pattern signal PAT is half of the period T of a test pattern signal in the normal test mode, the speed or rate of the test pattern signal PAT of the period T/2 is twice the speed or rate of test pattern signal of the period T. Accordingly, it is possible that a test of an IC under test is carried out at the speed or rate of two times the normal speed or rate, that is, at high speed or rate. Further, in the latter half period (T/2), if the waveform data T2R is stamped out by a clock pulse later in time than the clock $T_2$, a test of an IC can be perfomed at a speed or rate faster than the normal speed and slower than the speed of twice the normal speed. That is, it is possible that a test of an IC can be implemented at any speed or rate between the normal speed and the speed of twice the normal speed.

Moreover, in the mode where a test pattern signal is written into an IC under test, the waveform data T3L of logical "H" is read out of the first waveform memory WFM1 in response to a pattern generation command from the first pattern generator PG1, the rising portion of the waveform data T3L is stamped out by a clock pulse $T_3$ in the associated AND gate, that is, the rising portion of the waveform data T3L is ANDed with the clock pulse $T_3$ in the associated AND gate so that a pulse T3 is formed as shown in FIG. 1D. This pulse T3 is given to a set terminal S of the second set/reset flip-flop SRFF2 thereby generating an output of logical "1" from the second set/reset flip-flop SRFF2 at the leading edge of the pulse.

Also, the waveform data T4T is read out of the second waveform memory WFM2 in response to a pattern generation command from the second pattern generator PG2, the rising portion of the waveform data T4T is stamped out by a clock pulse $T_4$ in the associated AND gate, that is, the rising portion of the waveform data T4T is ANDed with the clock pulse $T_4$ in the associated AND gate so that a pulse T4 is formed as shown in FIG. 1D. This pulse T4 is given to a reset terminal R of the second set/reset flip-flop SRFF2 thereby inverting the output of logical "1" of the second set/reset flip-flop SRFF2 to the output of logical "0" at the leading edge of the pulse.

Thus, a driver control signal DRE of logical "1" shown in FIG. 1E is produced and is applied to the control terminal of the driver DR. As a result, the driver DR turns to the output mode due to the application of logical "1" to its control terminal, thereby to apply a test pattern signal PAT of the speed twice the normal speed to an IC under test 10. When the driver control signal DRE falls down to logical "0", the driver DR turns to the high impedance mode so that it becomes in the state of output inhibition. Accordingly, the driver DR is controlled to be in the state that a read-out output $S_{IC}$ from the IC under test 10 is given to the comparator CPH and CPL.

Next, in the mode where data written in the IC under test 10 is read out thereof, in response to the expected value data "L" ($PAT_{ABC}$=L) from the first pattern generator PG1 and the expected value data "H" ($PAT_{ABC}$=H) from the second pattern generator PG2, the expected value signals EXP1 and EXP1Z are generated from the first waveform memory WFM1 and the expected value signals EXP2 and EXP2Z are generated from the second waveform memory WFM2, and these signals are supplied to the corresponding first and second logical comparators DC1 and DC2, respectively.

The first logical comparator DC1 comprises, in this example, two AND gates to respective one non-inverting inputs of which the expected value signals EXP1 and EXP1Z are supplied respectively, and an OR circuit which multiplexes the outputs of these AND gates to output a multiplexed signal. The second logical comparator DC2 comprises, in this example, two AND gates to respective one non-inverting inputs of which the expected value signals EXP2 and EXP2Z are supplied respectively, and an OR circuit which multiplexes the outputs of these AND gates to output a multiplexed signal.

The first logical comparator DC1 takes AND of the expected value signal EXP1 and a comparison output SH of the H-logic comparator CPH and AND of the expected value signal EXP1Z and the inverted output of the comparison output SH of the H-logic comparator CPH. The second logical comparator DC2 takes AND of the expected value signal EXP2 and a comparison output SL of the L-logic comparator CPL and AND of the expected value signal EXP2Z and the inverted output of the comparison output SL of the L-logic comparator CPL.

The comparison results from AND gates of the first logical comparator DC1 are stored in the first failure analysis memory FM1 through the second multiplexer MUX2, and the comparison results from AND gates of the second logical comparator DC2 are stored in the second failure analysis memory FM2 through the third multiplexer MUX3. Thus, it is possible to store failure data in the failure analysis memories at the speed or rate of twice the normal speed or rate so that a test of an IC can be implemented at the speed or rate of twice the normal speed or rate.

As described above, according to the present invention, a second pattern generator PG2, a second waveform shaping device FC2, a second logical comparator DC2 and a second failure analysis memory FM2 are added to each pin unit UN. Therefore, it is possible to carry out a test of an IC at the speed of twice the normal speed without using another pin unit. Consequently, a high speed test can be performed without reducing the number of pins of an IC which is testable at one time, and hence there is obtained an advantage that even any memory of a high speed operation type having many pins can be tested at a high speed.

In addition, an arrangement of a second pattern generator PG2, a second waveform shaping device FC2, a second logical comparator DC2 and a second failure analysis memory FM2 is considerably smaller in scale than the entire configuration of one pin unit. Accordingly, a high speed test can be implemented by adding only a small scale arrangement to an IC tester, and hence there is obtained an advantage that a high speed test can be implemented at lower cost as compared with an increase of another one pin unit for each pin.

Moreover, according to the present invention, as shown in FIG. 3A, the pattern generation commands to be written in the two pattern generators PG1 and PG2 may be described as "1", "0", "L", "H" . . . in order of addresses, for example, with respect to pin No. 1. Therefore, there has a characteristic that a rate of error occurrence in describing the pattern generation commands can be reduced to a lower value.

On the contrary, according to the conventional pin multiplex method, as shown in FIG. 3B, assuming that the two pin units for a pin No. 1 and a pin No. 2 are combined, the pattern generation commands "1" and "0" must be described in the same addresses of the respective pattern generators associated with the pin No. 1 and pin No. 2 and the next pattern generation commands "L" and "H" must be described in the next same addresses of the respective pattern generators corresponding to the pin No. 1 and pin No. 2. Since the pattern generation commands are not arranged in order of addresses in this conventional description manner, there is a drawback that an error in description errors is apt to occur.

In addition, the present invention is arranged such that the multiplexers MUX1–MUX3 are provided, and hence there is an advantage that not only a high speed test can be performed but also the normal speed test can be performed.

What is claimed is:

1. A semiconductor device testing apparatus for testing a semiconductor device under test comprising pin units each being provided for corresponding one of pins of the semiconductor device under test, each of said pin units comprising:

first pattern generating means for generating pattern generation commands and expected value data of odd addresses;

second pattern generating means for generating pattern generation commands and expected value data of even addresses;

waveform shaping means comprising:
first waveform storage means for deriving first waveform data in response to pattern generation commands from one of said pattern generating means, and
second waveform storage means for deriving second waveform data in response to pattern generation commands from either one of said pattern generating means;

switching means for switching supply paths of the pattern generation commands and expected value data from said pattern generating means to said waveform storage means so as to supply only pattern generation commands and expected value data from said one of said pattern generating means simultaneously to said first and second waveform storage means when a normal speed test pattern signal having a normal period usable for a normal speed test operation is required, and to supply pattern generation commands and expected value data from said one of said pattern generating means to said first waveform storage means and pattern generation commands and expected value data from the other of said pattern generating means to said second waveform storage means, respectively, when a high speed test pattern signal having a period shorter than that of the normal speed test pattern signal usable for a high speed test operation is required; and means for producing the normal speed test pattern signal and the high seed test pattern signal based on the waveform data read out of said first and second waveform storage means.

2. The semiconductor device testing apparatus according to claim 1, wherein said test pattern signal producing means produces the high speed test pattern signal usable for the higher speed test having any one of periods between the period of the test pattern signal usable for the normal speed test and equal to half of said period.

3. The semiconductor device testing apparatus according to claim 1, wherein each of said pin units further comprises:

a first logical comparator comparing data read out of the semiconductor device under test with an expected value signal supplied from said first waveform storage means;

a second logical comparator comparing data read out of the semiconductor device under test with an expected value signal supplied from said second waveform storage means;

a first failure analysis memory storing a comparison result from said first logical comparator;

a second failure analysis memory storing a comparison result from said second logical comparator; and switching means for switching supply paths of the comparison results from said logical comparators to said failure analysis memories so as to supply comparison results from said first and second logical comparators simultaneously to said first and second failure analysis memories.

4. The semiconductor device testing apparatus according to claim 1, wherein when the high speed test pattern signal is required, the odd addresses of said first waveform storage means are accessed by pattern generation commands from said first pattern generating means, and the even addresses of said second waveform storage means are accessed by pattern generation commands from said second pattern generating means.

5. The semiconductor device testing apparatus according to claim 4, wherein each of said first and second waveform storage means comprises odd addresses for storing the waveform data and expected value signals responsive to the pattern generation commands and expected value data of odd addresses, and even addresses for storing the waveform data and expected value signals responsive to the pattern generation commands and expected value data of even addresses.

6. A semiconductor device testing apparatus for testing a semiconductor device under a high speed test operation by using a high speed test pattern signal having a period shorter than that of a normal speed test pattern signal usable for a normal speed test operation comprising:

first pattern generating means for generating pattern generation commands and expected value data of odd addresses;

second pattern generating means for generating a pattern generation commands and expected value data of even addresses;

first waveform shaping means for deriving waveform data and expected value signals in response to the pattern generation commands and the expected value data from the first pattern generating means;

second waveform shaping means for deriving waveform data and expected value signals in response to the pattern generation commands and expected value data from the second pattern generating means; and means for producing the high speed test pattern signal in response to the waveform data from the first and second waveform shaping means.

7. The semiconductor device testing apparatus according to claim 1, which further comprises:

a first logical comparator comparing test result data from the semiconductor device with the expected value signals from said first waveform shaping means;

a second logical comparator comparing the test result data from the semiconductor device with the expected value signals from said second waveform shaping means;

a first failure analysis memory storing comparison result from the first logical comparator; and a second failure analysis memory storing comparison result from the second logical comparator.

* * * * *